United States Patent [19]
Lin et al.

[11] Patent Number: 5,204,518
[45] Date of Patent: Apr. 20, 1993

[54] BACKGROUND LIGHT COMPENSATION FOR SENSOR ARRAY

[75] Inventors: Shi-Tron Lin, Irvine; Steven A. Buhler, Redondo Beach, both of Calif.

[73] Assignee: Xerox Corporation, Stamford, Conn.

[21] Appl. No.: 812,985

[22] Filed: Dec. 24, 1991

[51] Int. Cl.⁵ ............................................. G01J 40/14
[52] U.S. Cl. ............................ 250/206.1; 250/203.3; 250/231.18; 250/237 G
[58] Field of Search ............... 250/206.2, 206.1, 203.3, 250/203.6, 237 G, 231.18; 356/141, 152

[56] References Cited

U.S. PATENT DOCUMENTS

| | | | |
|---|---|---|---|
| 3,599,004 | 8/1971 | Grendelmeier | 250/206.1 |
| 4,769,546 | 9/1988 | Kniffler et al. | 250/206.2 |
| 4,857,721 | 8/1989 | Dunavan et al. | 250/206.1 |
| 4,982,081 | 1/1991 | Schmidt | 250/208.2 |

*Primary Examiner*—David C. Nelms
*Assistant Examiner*—T. Davenport
*Attorney, Agent, or Firm*—Fariba Rad

[57] ABSTRACT

A position detector for a scanning beam comprising a plurality of rows of spaced apart sensors. Each row of sensors includes a plurality of logic zero sensors and a plurality of logic one sensors which are arranged in alternating logic order. Each row is arranged such that it is symmetrical about its center. Equal areas of logic zero sensors on each side of the center are equal distances away from the center and equal areas of logic one sensors on each side of the center are equal distances away from the center to substantially cancel out any background light effects on the sensors.

2 Claims, 12 Drawing Sheets

| j1 | j2 | j3 | j4 | j5 |
|---|---|---|---|---|
| 0 | 0 | 0 | 0 | 0 |
| 0 | 0 | 0 | 0 | 1 |
| 0 | 0 | 0 | 1 | 1 |
| 0 | 0 | 0 | 1 | 0 |
| 0 | 0 | 1 | 1 | 0 |
| 0 | 0 | 1 | 1 | 1 |
| 0 | 0 | 1 | 0 | 1 |
| 0 | 0 | 1 | 0 | 0 |
| 0 | 1 | 1 | 0 | 0 |
| 0 | 1 | 1 | 0 | 1 |
| 0 | 1 | 1 | 1 | 1 |
| 0 | 1 | 1 | 1 | 0 |
| 0 | 1 | 0 | 1 | 0 |
| 0 | 1 | 0 | 1 | 1 |
| 0 | 1 | 0 | 0 | 1 |
| 0 | 1 | 0 | 0 | 0 |
| 1 | 1 | 0 | 0 | 0 |
| 1 | 1 | 0 | 0 | 1 |
| 1 | 1 | 0 | 1 | 1 |
| 1 | 1 | 0 | 1 | 0 |
| 1 | 1 | 1 | 1 | 0 |
| 1 | 1 | 1 | 1 | 1 |
| 1 | 1 | 1 | 0 | 1 |
| 1 | 1 | 1 | 0 | 0 |
| 1 | 0 | 1 | 0 | 0 |
| 1 | 0 | 1 | 0 | 1 |
| 1 | 0 | 1 | 1 | 1 |
| 1 | 0 | 1 | 1 | 0 |
| 1 | 0 | 0 | 1 | 0 |
| 1 | 0 | 0 | 1 | 1 |
| 1 | 0 | 0 | 0 | 1 |
| 1 | 0 | 0 | 0 | 0 |

FIG. 8A

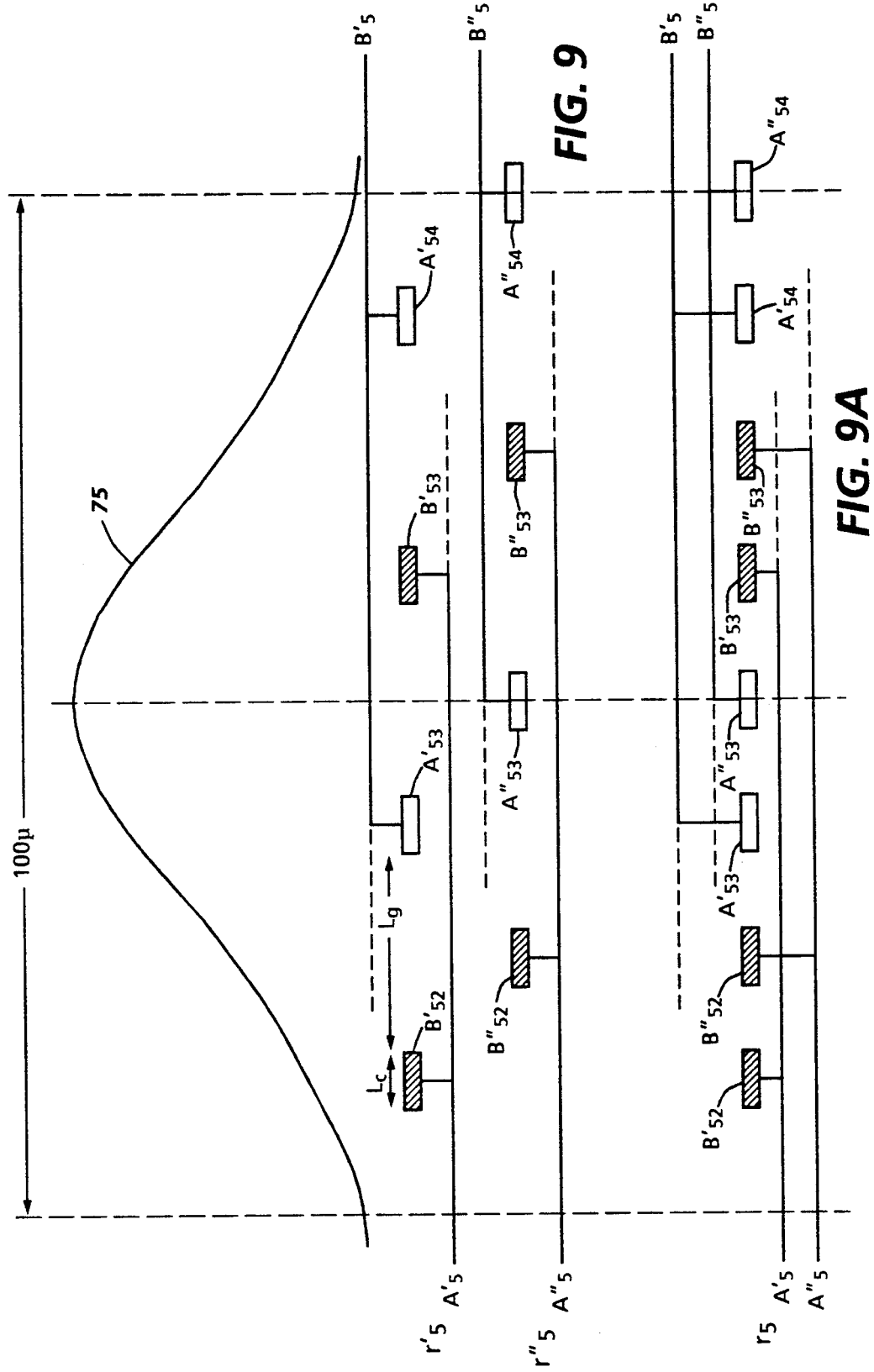

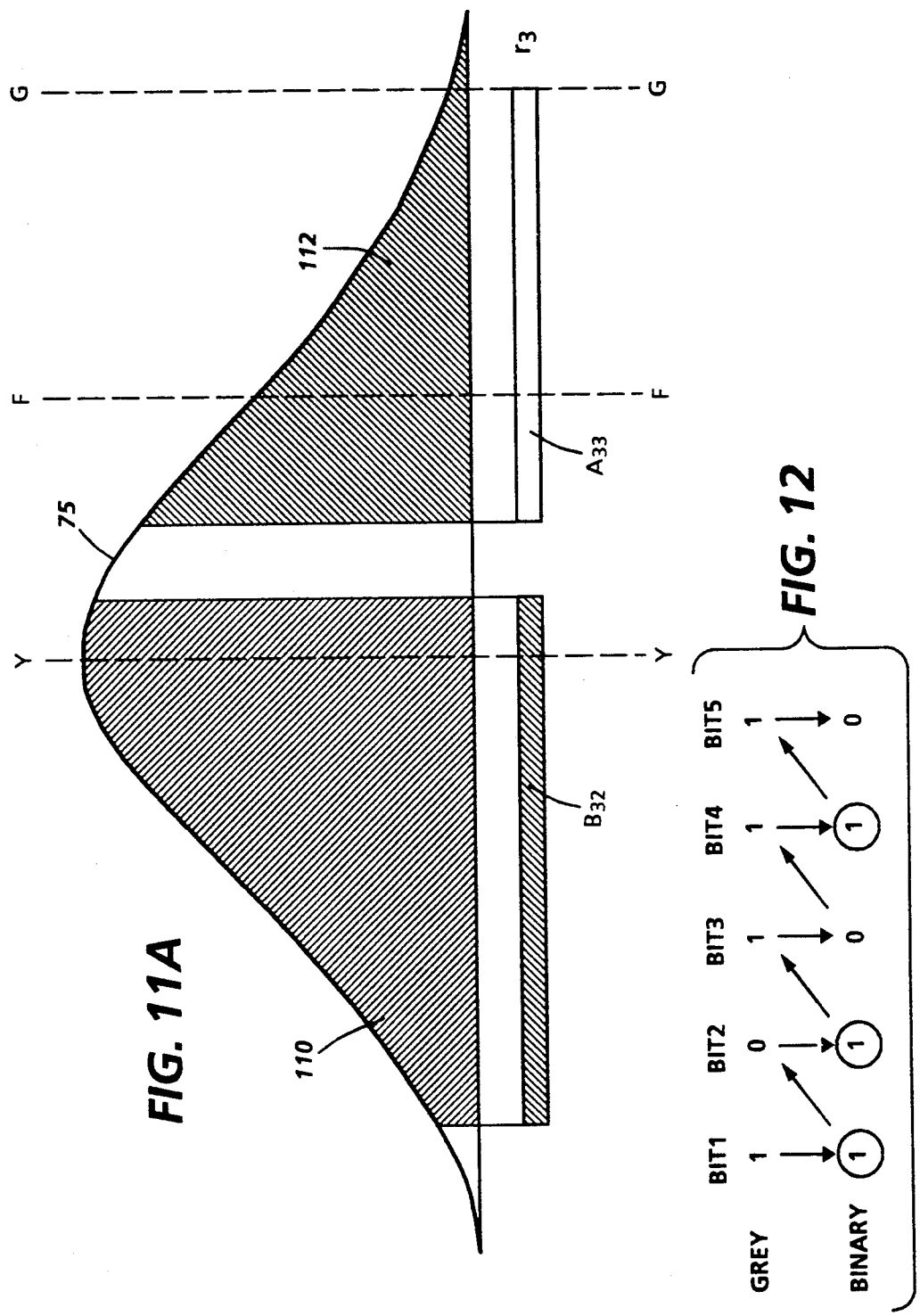

BACKGROUND LIGHT COMPENSATION FOR SENSOR ARRAY

BACKGROUND OF INVENTION

This invention relates generally to a design of a binary position sensor, and more specifically, to an apparatus for determining the position of a laser beam at a resolution which is smaller than the laser beam size.

Traditionally, photo sensors are used for different purposes, such as measuring angle, distance, height, centering, surface uniformity and other parameters related to position sensing. One of the most used applications of photo sensors is monitoring the displacement of a path that a scanning beam covers in reference to a line to be scanned.

Different sensors use a grating with binary format apertures, as shown in FIG. 1, either on a rectangular plate 10 or a circular disk (not shown) for measuring parameters related to position sensing or for measuring the rotation angle or the number of rotations. The apertures 12 on the grating tracks $t_1$, $t_2$ and $t_3$ provide a passage for the light and the nontransparent segments 14 (the areas between the apertures on each track) block the light from passing through. By placing a light source 16 on one side of the grating plate or the grating disk, the light emitted from the light source passes only through the apertures 12. On the opposite side of the grating plate or the grating disk, where there is an aperture 12 there is light and where there is nontransparent segment 14 there is darkness. The light and the darkness can be sensed by having one sensor for each grating track. The grating plate 10 moves in X—X direction. Therefore, the light sensors 18, 20 and 22 receive light or darkness depending on if they are positioned behind an aperture 12 or behind a nontransparent segment 14. In the example shown in FIG. 1, the light sensors 18 and 20 which receive the light generate an electric signal representing logic 1 and the sensor 22 which is in dark stays inactive representing logic 0. By reading out the outputs of the sensors with each sensor representing one binary bit, the binary position of the plate or the angle of rotation is determined.

The above apparatus does not have a high resolution. In order to improve the resolution, the number of the grating tracks should be increased and in each grating track the number of apertures should also be increased. The problem arises when the apertures and the nontransparent segments become smaller than the width of the light or the laser beam, shown in FIG. 2. In this case, if the peak N—N of the Gaussian distribution 25 of the light beam happens to be on a nontransparent segment 14, but the beam size extends over onto the adjacent aperture 12, instead of reading out a logic 0 for darkness 26, a logic 1 for light 28 passing through aperture 12 is read out. Therefore, increasing the number of grating tracks and the number of apertures is not an effective way of improving the resolution.

SUMMARY OF THE INVENTION

It is an object of this invention to improve the resolution of the binary sensors of the prior art by replacing the apertures and the nontransparent segments by alternate photocells to sense a light beam at any position. A binary photo position sensor of this invention consists of an array of elongated photocells oriented perpendicular to the main scan direction of a light beam with each row of photocells representing one bit of data. To represent logic 1 and logic 0, each row consists of alternating types of photocells A and B, type A representing a logic 0 and type B representing a logic 1. In each row, all the photocells of the same group are connected to each other. By comparing the outputs of the two types of photocells on each row, the logic value represented by that row is determined.

It is another object of this invention to further improve the resolution of the binary photo sensors by keeping the pitch of the alternate photocells to a size of not less than ¼ of the width (Gaussian distribution $\pm 3\sigma$) of the light or laser beam and improve the resolution by offsetting the rows of photocells. To avoid reducing the pitch of the photocells to less than ¼ of the width of the light beam, certain number of rows (the number of rows depend on the resolution of that bit) are assigned to a group and each group is assigned to a bit. In addition, the center of each row is offset a predetermined distance from the center of the scanning region. Offsetting the rows of photocells while keeping the pitch constant has the effect of reducing the pitch. Finally, by comparing the outputs of each group of photocells, the logic value represented by that group is determined.

BRIEF DESCRIPTION OF THE DRAWINGS

FIG. 8A is a look-up table of Grey code for five bits;

FIG. 9 is a modification of rows $r'_5$ and $r''_5$ where the photocells are substantially smaller than the pitch between the photocells;

FIG. 9A is another modification showing rows $r'_5$ and $r''_5$ of FIG. 9A combined into one row;

FIG. 11A is a view showing the Gaussian distribution of the laser beam sensor on photocells with a pitch greater than ½ of the laser beam width at the edge of the scanning region and in the border region; and FIG. 12 is an example of converting a Grey output to a Binary output.

DESCRIPTION OF THE PREFERRED EMBODIMENT

Figure 3:
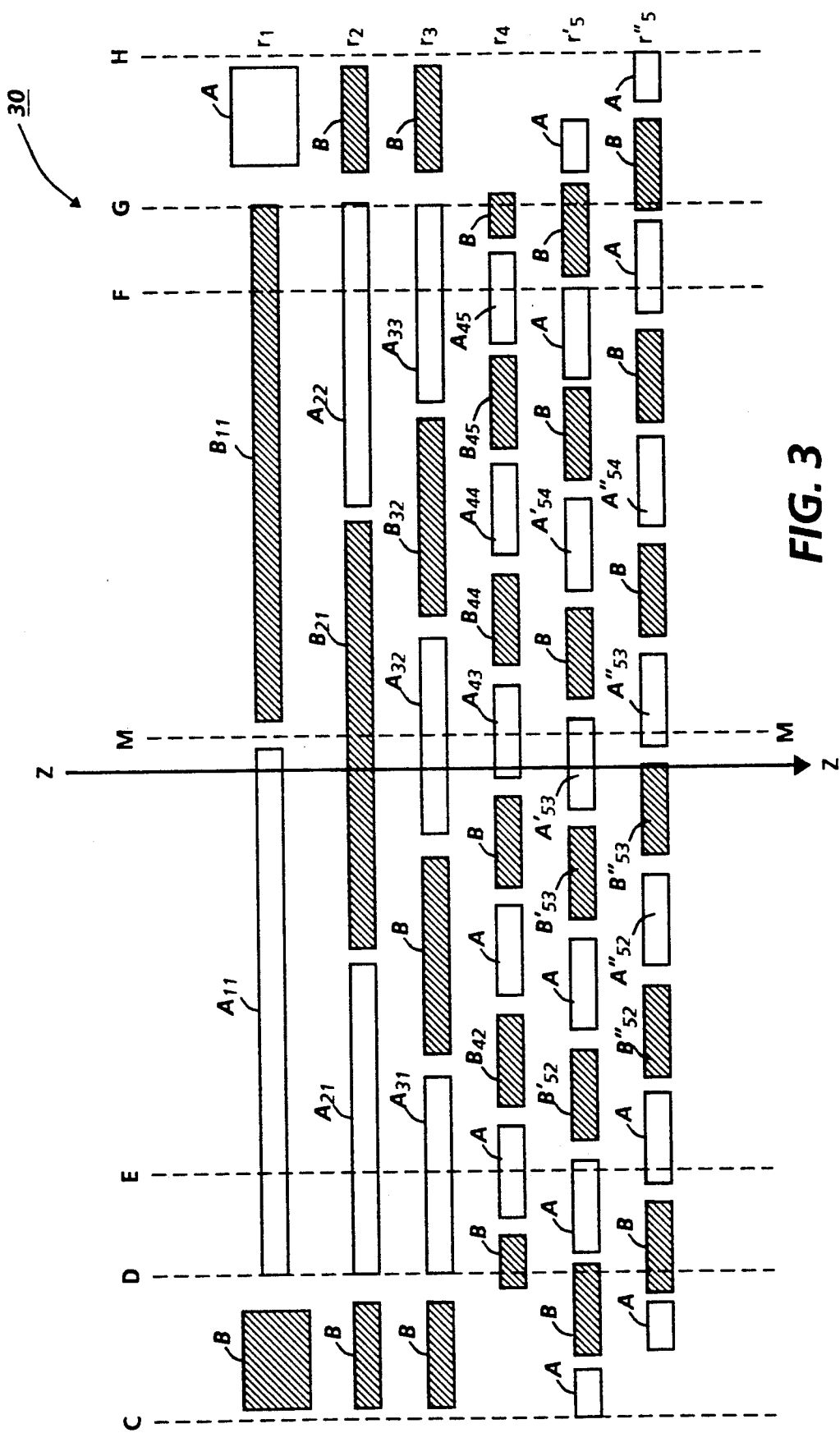
FIG. 3 is a view of a binary photo position sensor.

According to FIG. 3, there is shown a binary photo position sensor 30 which consists of an array of $r_1$, $r_2$, $r_3$, $r_4$, $r'_5$ and $r''_5$ of elongated photocells oriented perpendicular to the main scan direction Z—Z of a laser beam with each row of photocells representing one bit of data except row $r'_5$ and $r''_5$ which will be discussed in detail further on. The photocell array 30 covers an area between C and H having separate segments: EF as the scanning region, DE and FG as the borders and finally CD and GH as the background light compensating regions.

Figure 1:
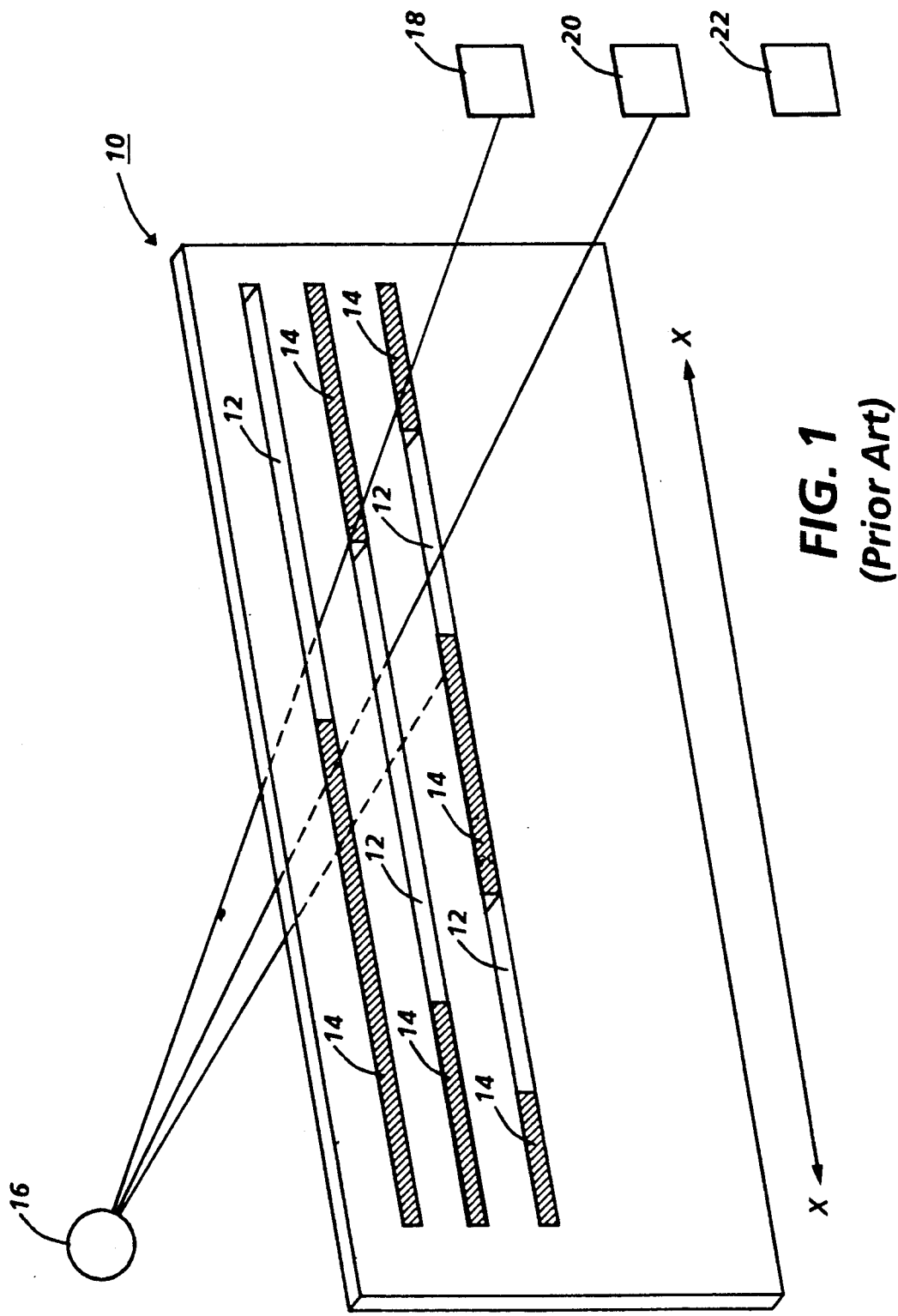
FIG. 1 is a view of a prior art binary grating plate.
Figure 2:
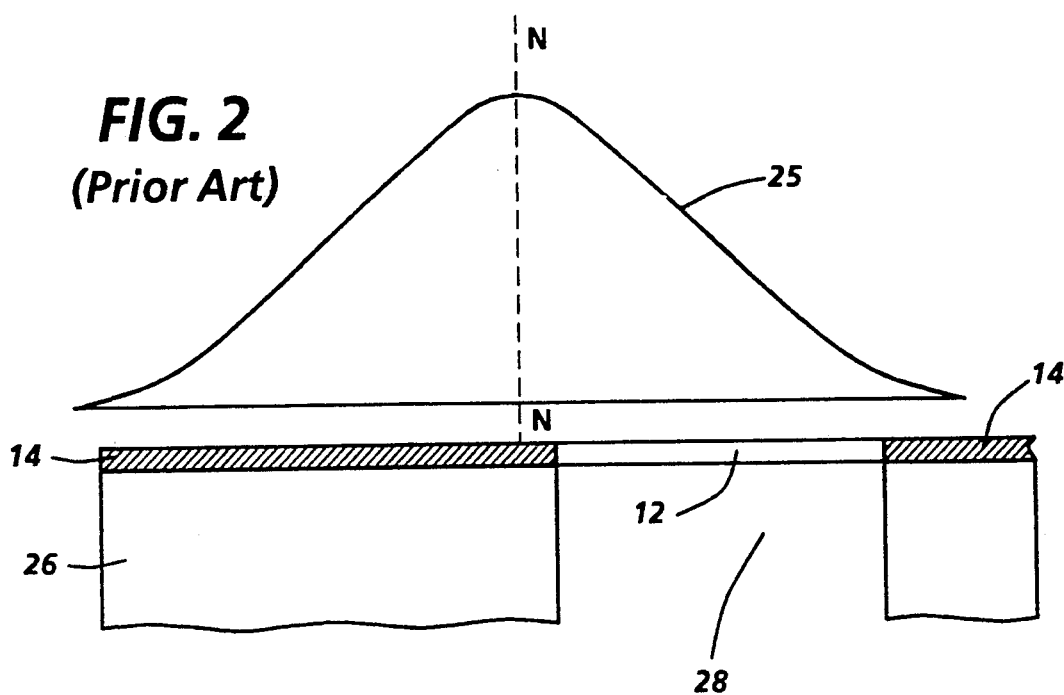
FIG. 2 illustrates a prior art problem when the width of the laser beam is greater than apertures and the none transparent segments.
Figure 5:
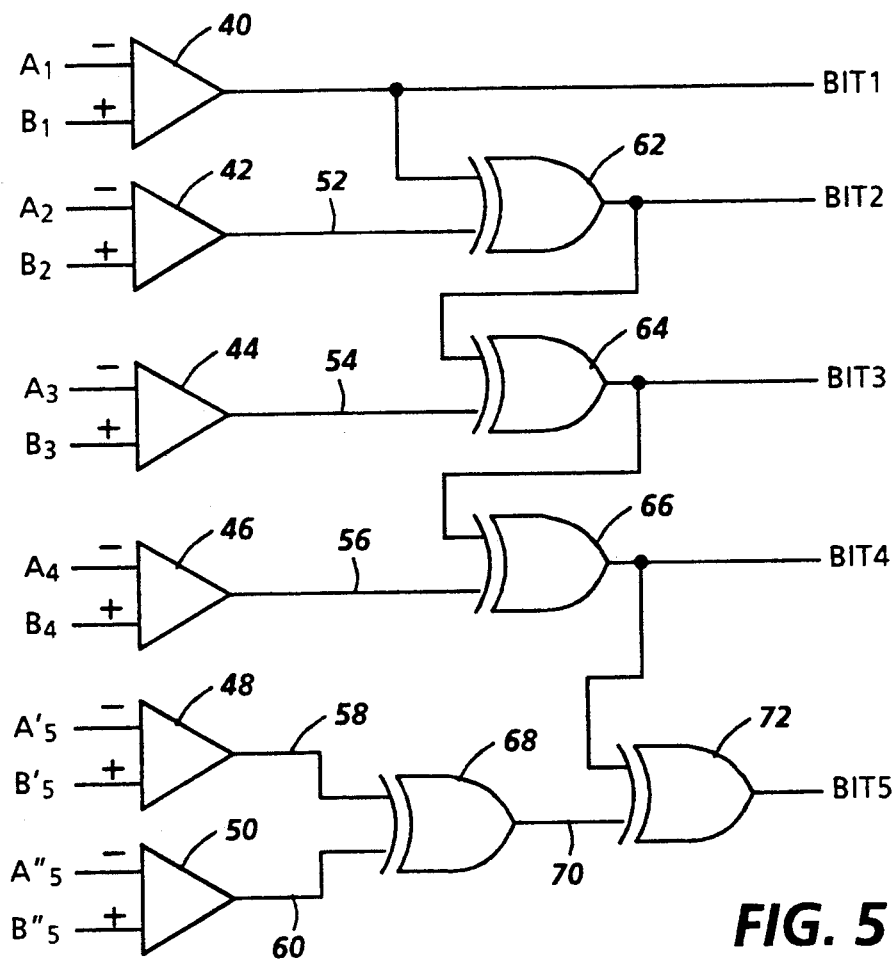
FIG. 5 is a logic design for receiving the electric energy from the rows of photocells and converting them to a Binary output.
Figure 4:
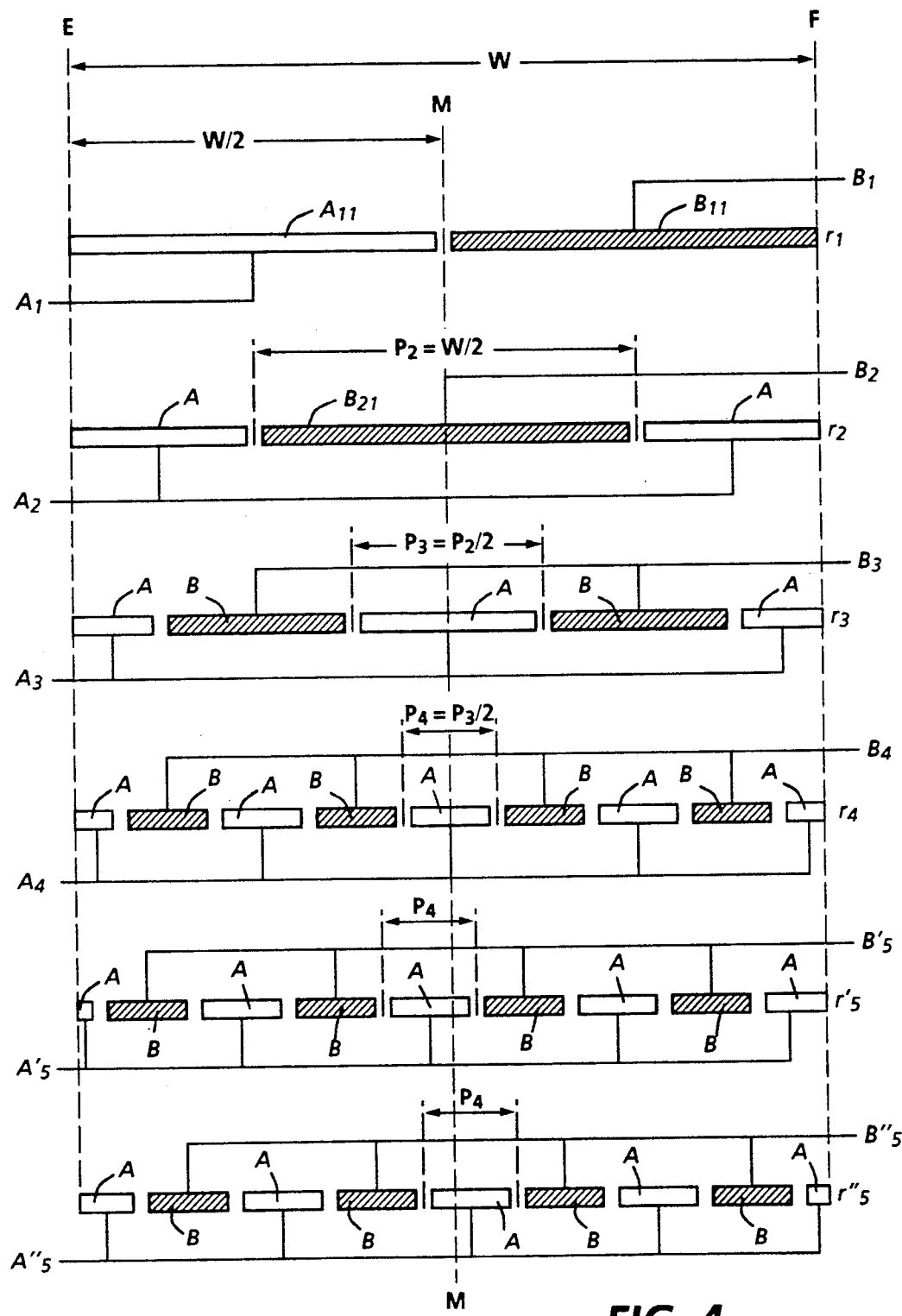
FIG. 4 is a magnified view of a portion of the binary photo position sensor of FIG. 3.

To represent logic 1 and logic 0, each row consists of alternating types of photocells A and B; type A representing a logic 0 and type B representing a logic 1. In each row, all the photocells of the same group are connected to each other as shown in FIG. 4. Therefore, each row has two outputs: $A_1$ and $B_1$ for the first row $r_1$, $A_2$ and $B_2$ for the second row $r_2$, $A_3$ and $B_3$ for the third row $r_3$, $A_4$ and $B_4$ for the fourth row $r_4$, $A'_5$ and $B'_5$ for the fifth row $r'_5$ and $A''_5$ and $B''_5$ for the sixth row $r''_5$. Referring to FIG. 5, for each row there is a comparator to compare the outputs of groups B and A for determining the logic value (in Grey format) represented by that row, except for rows $r_5'$ and $r_5''$. Comparators 40, 42, 44 and 46 are dedicated to rows $r_1$, $r_2$, $r_3$ and $r_4$, respectively, and they compare $B_1$ to $A_1$, $B_2$ to $A_2$, $B_3$ to $A_3$ and $B_4$ to $A_4$ respectively and send out the Grey logic values of rows $r_1$, $r_2$, $r_3$ and $r_4$ on Bit1 and on output lines 52, 54 and 56 respectively. Comparators 48 and 50 compare the outputs of groups A and B of rows $r_5'$ and $r_5''$ respectively and send out the results on output lines 58 and 60 to an exclusive OR 68 to combine the results from rows $r_5'$ and $r_5''$ in order to generate the Grey logic value of Bit5 on output line 70. Exclusive ORs 62, 64, 66 and 72 are used to convert the Grey logic value to a binary logic value and send out the binary result on Bit2, Bit3, Bit4 and Bit5. There is no need to use an exclusive OR for Bit1 which is the most significant bit since the most significant bit of the binary format is the same as the most significant bit of the Grey format.

Referring back to FIG. 4, the first row $r_1$ has two long photocells $A_{11}$ and $B_{11}$, each having a length within the scanning region EF which is slightly less than half of the width W of the scanning region EF. There is a gap between the two photocells $A_{11}$ and $B_{11}$ and the center of the gap is located on line M—M (line passing through the center of scanning region). The gap size should not be larger than the width of the laser beam. If the gap size is designed to be larger than the laser beam size, then the laser beam passes through the gap without energizing either of the photocells $A_{11}$ and $B_{11}$.

Starting with the second row, each row, except the rows that are offset ($r'_5$ and $r''_5$), has a photocell centered on line M—M. For example, row $r_2$ has $B_{21}$ centered on line M—M and has a pitch $P_2$ (the distance between the center of a gap to the center of the following gap) equal to W/2. In the following rows the pitch is reduced to half of the pitch of the previous row. Row $r_3$ has a pitch $P_3$ equal to $P_2/2$ and row $r_4$ has a pitch $P_4$ equal to $P_3/2$.

Figure 6:
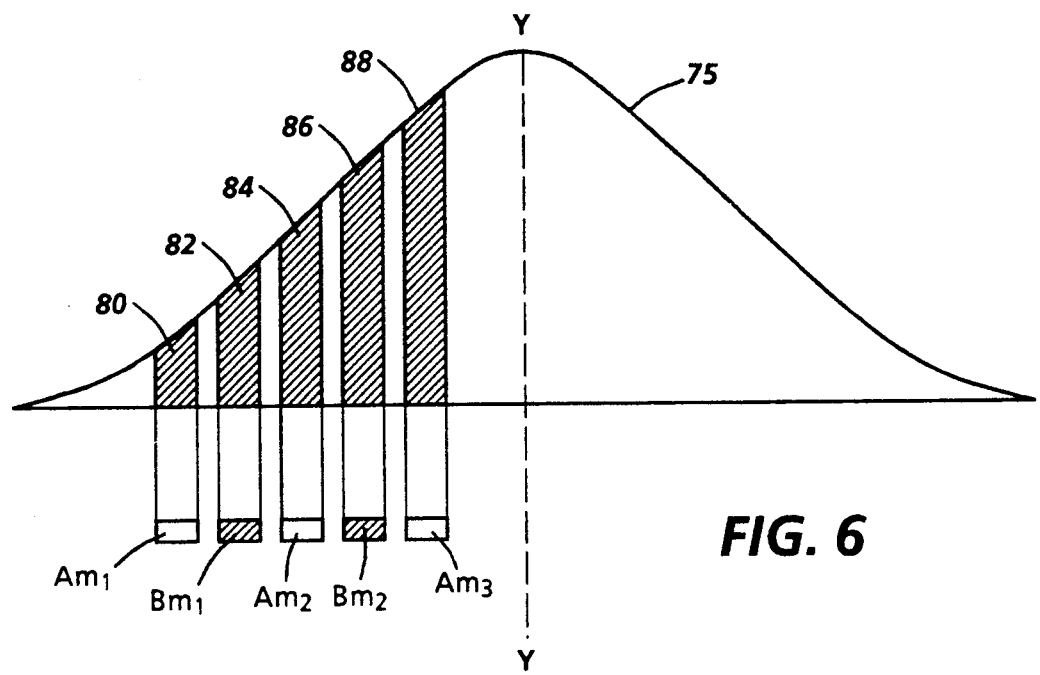
FIG. 6 is an example of the energy received by photocells with a pitch smaller than ¼ of the laser beam width from the Gaussian distribution of a laser beam.
Figure 7:
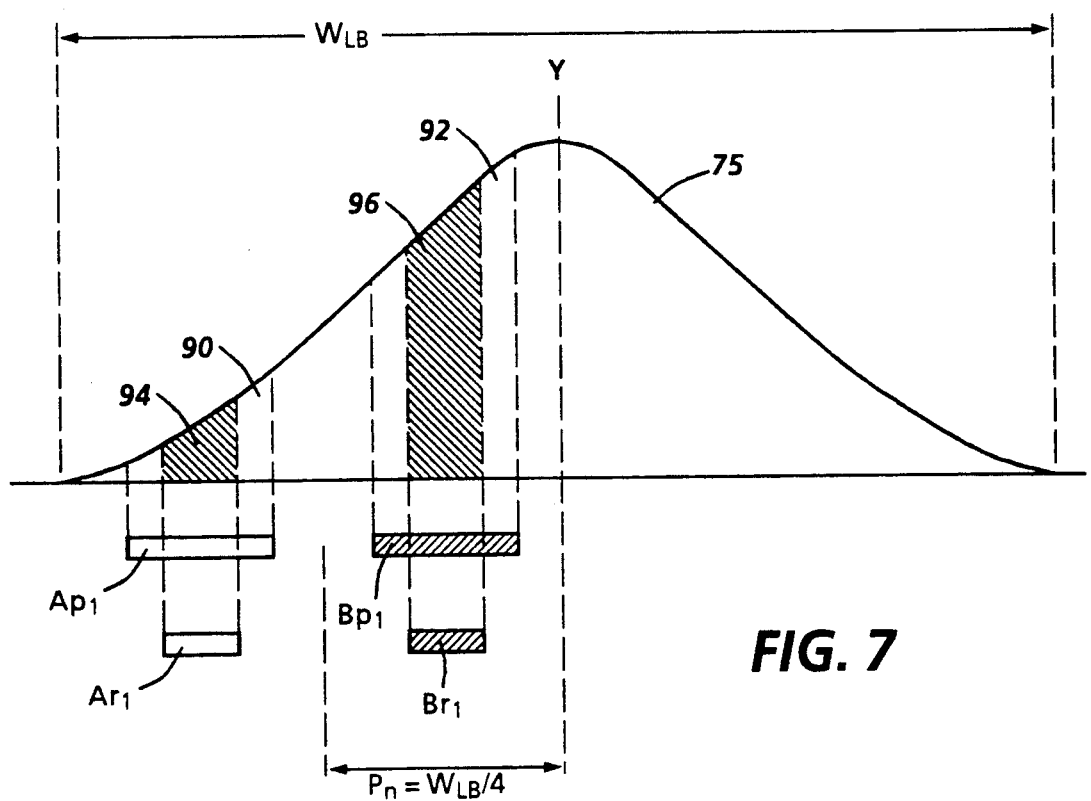
FIG. 7 is an example of the energy received by photocells with a pitch approximately equal to ¼ of the laser beam width from the Gaussian distribution of a laser beam.

There is a limit in reducing the pitch. The pitch should not be reduced to less than ¼ of the width of the laser beam. Of course, with VLSI technology it is possible to make photocells smaller than ¼ of the width of the laser beam, but for better resolution the pitch should not be reduced to less than ¼ of the width of the laser beam. The reason for not reducing the pitch to less than ¼ of the width of the laser beam is that when the pitch is reduced to smaller segments, the amount of light energy received by each photocell is close to the amount of energy received by the adjacent photocells. In other words, as shown in FIG. 6, there is only a slight difference between the amount of energy 80, 82, 84, 86 and 88 collected on the adjacent photocells $A_{m1}$, $B_{m1}$, $A_{m2}$, $B_{m2}$ and $A_{m3}$ which is hard to detect. For example, there is only a small difference between the amount of energy 82 received by photocell $B_{m1}$ and the amount of energy 80 and 84 received by the photocells $A_{m1}$ and $A_{m2}$ respectively which are adjacent to $B_{m1}$. On the contrary, if the pitch $P_n$, as shown in FIG. 7, is kept at ¼ of the width $W_{LB}$ of the laser beam, the difference between the amount of energy collected by the adjacent photocells is large and therefore, it is easier to detect. When the pitch is kept at ¼ of the width of the laser beam, the photocells can be either short or long. As it is obvious from the illustration, it does not make any difference if the photocells are short or long since the difference between the amount of energy 94 and 96 received by the adjacent short photocells $A_{r1}$ and $B_{r1}$ or the difference between the amount of energy 90 and 92 received by the adjacent long photocells $A_{p1}$ and $B_{p1}$ is large enough to be detected.

Figure 8B:
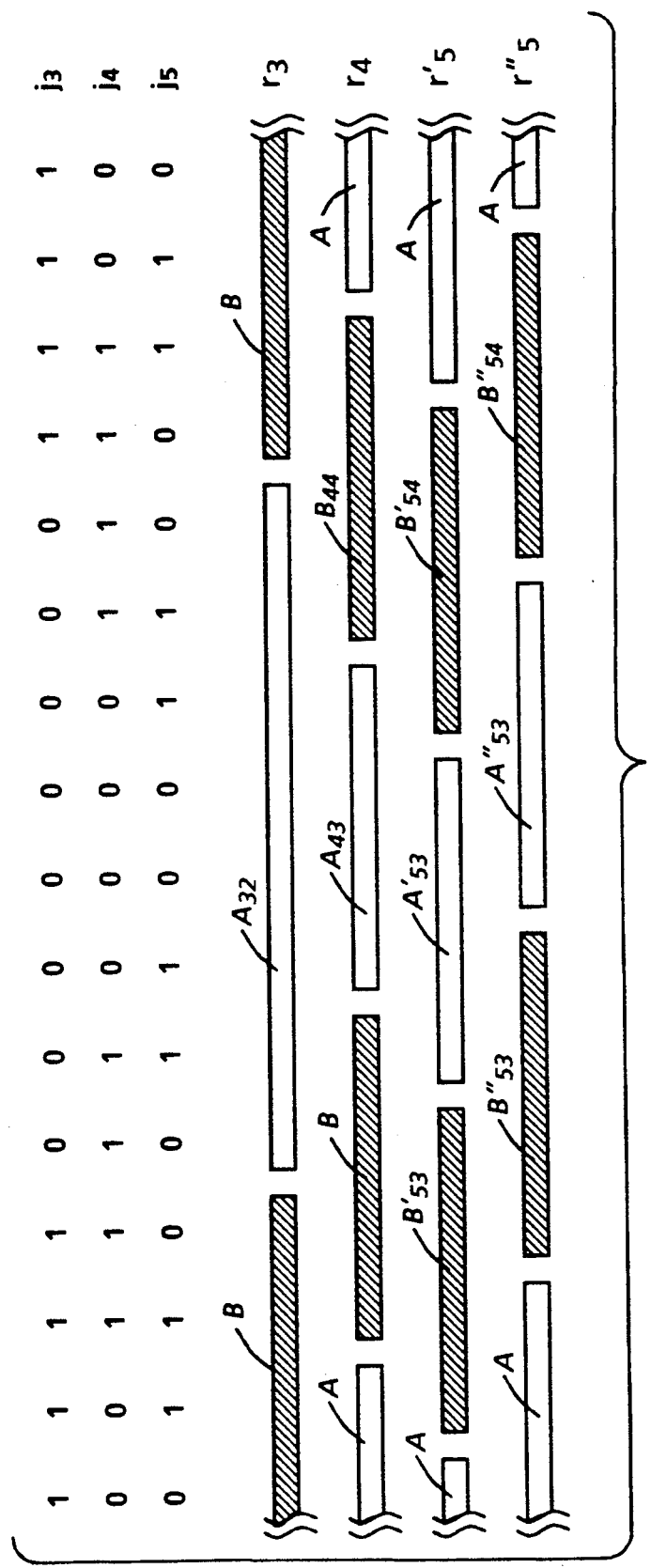
FIG. 8B is a magnified portion of the binary photo position sensor of FIG. 3 corresponding to a magnified portion of FIG. 8A.

Since the pitch can not be reduced to less than ¼ of the width of the laser beam, in order to improve the resolution further, the pitch is kept constant and the photocells are offset. By offsetting the row of photocells while keeping the pitch constant, the effect of reducing the pitch can be achieved. For the purpose of clarity, a magnified portion of FIG. 3 and also a magnified portion 98 of FIG. 8A (Grey Code) are shown together in 8B. As it is illustrated in FIG. 8B, rows $r_3$ and $r_4$ correspond to rows $j_3$ and $j_4$ respectively. Rows $r'_5$ combined together correspond to row $j_5$. Also, the A cells correspond to logic 0 and the B cells correspond to logic 1. Comparing $r_3$, $r_4$, $r'_5$ and $r''_5$ to $j_3$, $j_4$ and $j_5$, it is obvious that $A_{32}$ corresponds to eight 0s on $j_3$ and $A_{43}$ and $B_{44}$ correspond to four 0s and four 1s on $j_4$, respectively, which is the reason for $r_4$ having a pitch $P_4$ equal to $P_3/2$. By the same token, the photocells on the row which should represent $j_5$ should correspond to two 1s or two 0s of $j_5$ and therefore, should have a pitch $P_5$ equal to $P_4/2$. Since the pitch $P_4$ of row $r_4$ is equal to ¼ of the laser beam width, the pitch $P_5$ can not be reduced any further. As a result, the pitch $P_5$ is kept equal to $P_4$.

In order to keep the pitch $P_5$ equal to $P_4$, two rows of photocells $r'_5$ and $r''_5$ are needed and each row has to be offset to produce the logic shown on row $j_5$. By comparing the outputs of $r'_5$ and $r''_5$, where a light beam crosses a photocell in row $r'_5$ and a photocell in row $r''_5$ which belong to the same cell group (either group A or group B) the output is logic 0 and where the cells belong to different groups, the output is logic 1. For example, when the laser beam crosses $A'_{53}$ and $A''_{53}$ or it crosses $B'_{53}$ and $B''_{53}$ the output is logic 0 or when the laser beam crosses $A'_{53}$ and $B''_{53}$ or it crosses $B'_{54}$ and $A''_{53}$ the output is logic 1.

Referring back to FIG. 3, it should be noted that, due to offsetting the row of photocells, there is no symmetry on rows $r'_5$ and $r''_5$ with respect to line M—M, but there is a symmetry with respect to the center of the row which is at the center of the middle photocells $A'_{53}$ and $A''_{53}$ (FIG. 3).

To improve the resolution even more, four rows of photocells should be used to represent the following bit Bit6 (not shown) and eight rows of photocells to represent Bit7 (not shown). Of course depending on the width W of the scanning region EF and the width of the laser beam, reducing the pitch to $\frac{1}{4}$ of the laser beam can happen on different rows. For example, for a scanning region of 2048 microns with a laser beam width of 108 microns (Full Width Half Max=42 microns), reducing the pitch size to a pitch close to $\frac{1}{4}$ of the width of the laser beam happens on row 7 which represents Bit7 and if a resolution of 9 bits is required 6 more rows should be added: two rows for Bit8 and four more rows for Bit9. All together, thirteen rows are needed. With this arrangement a resolution of 4 micron is achieved.

In view of the above and in view of reducing the pitch of each row to half of the pitch of the preceding row and also in view of keeping the pitch greater than $\frac{1}{4}$ of the width of the laser beam, it follows that the pitch on each row is reduced to $\frac{1}{2}$ of the pitch of the preceding row until the pitch becomes less than $\frac{1}{2}$ and greater than $\frac{1}{4}$ of the laser beam size. At this range, the pitch is kept constant. Therefore, if the pitch of a row is equal to or greater than $\frac{1}{2}$ of the laser beam size that pitch will be reduced by half to generate the pitch for the next row which falls in the range of less than $\frac{1}{2}$ and greater than $\frac{1}{4}$ of the laser beam size. The pitch for all subsequent rows is kept constant and such rows will be offset with one another and with all preceding rows.

In order to make a compact array, the photocells of rows $r'_5$ and $r''_5$ can be designed to be short enough to be placed on one row while keeping the pitch equal to $\frac{1}{4}$ of the width of the laser beam. According to FIG. 9, which for simplicity shows only a portion of row $r_5'$ and a portion of row $r_5''$, the photocells $B'_{52}$, $A'_{53}$, $B'_{53}$, $A'_{54}$, $B''_{52}$, $A''_{53}$, $B''_{53}$ and $A''_{54}$ can be designed to be smaller than the gap size. Of course, the photocells should not be smaller than 2 to 4 microns since they loose accuracy. For example, with a beam width of 100 microns, the pitch is 25 microns and the cell length $L_c$ can be designed to be 10 microns which leaves a gap size $L_g$ of 15 microns. Having the cell lengths $L_c$ shorter than the gap size $L_g$ provides the possibility of placing the cells from row $r''_5$ in between the cells of row $r'_5$ as shown in FIG. 9A. Placing the cells from both rows $r'_5$ and $r''_5$ on one row does not affect the read out since the connection between the cells is kept the same. Therefore, the outputs $A'_5$, $B'_5$, $A''_5$ and $B''_5$ of FIG. 9A are the same as the outputs $A'_5$, $B'_5$, $A''_5$ and $B''_5$ of FIG. 9. Of course, it has to be understood that the pitch between the photocells of FIG. 9A is $\frac{1}{8}$ of the laser beam size but the pitch between the photocells of each group is still kept at $\frac{1}{4}$ of the laser beam size. For example, the pitch between $B'_{52}$ and $B''_{52}$ is $\frac{1}{8}$ of the laser beam size but the pitch between $B'_{52}$ and $A'_{53}$ or the pitch between $B''_{52}$ and $A''_{53}$ are $\frac{1}{4}$ of the laser beam size.

Figure 10:
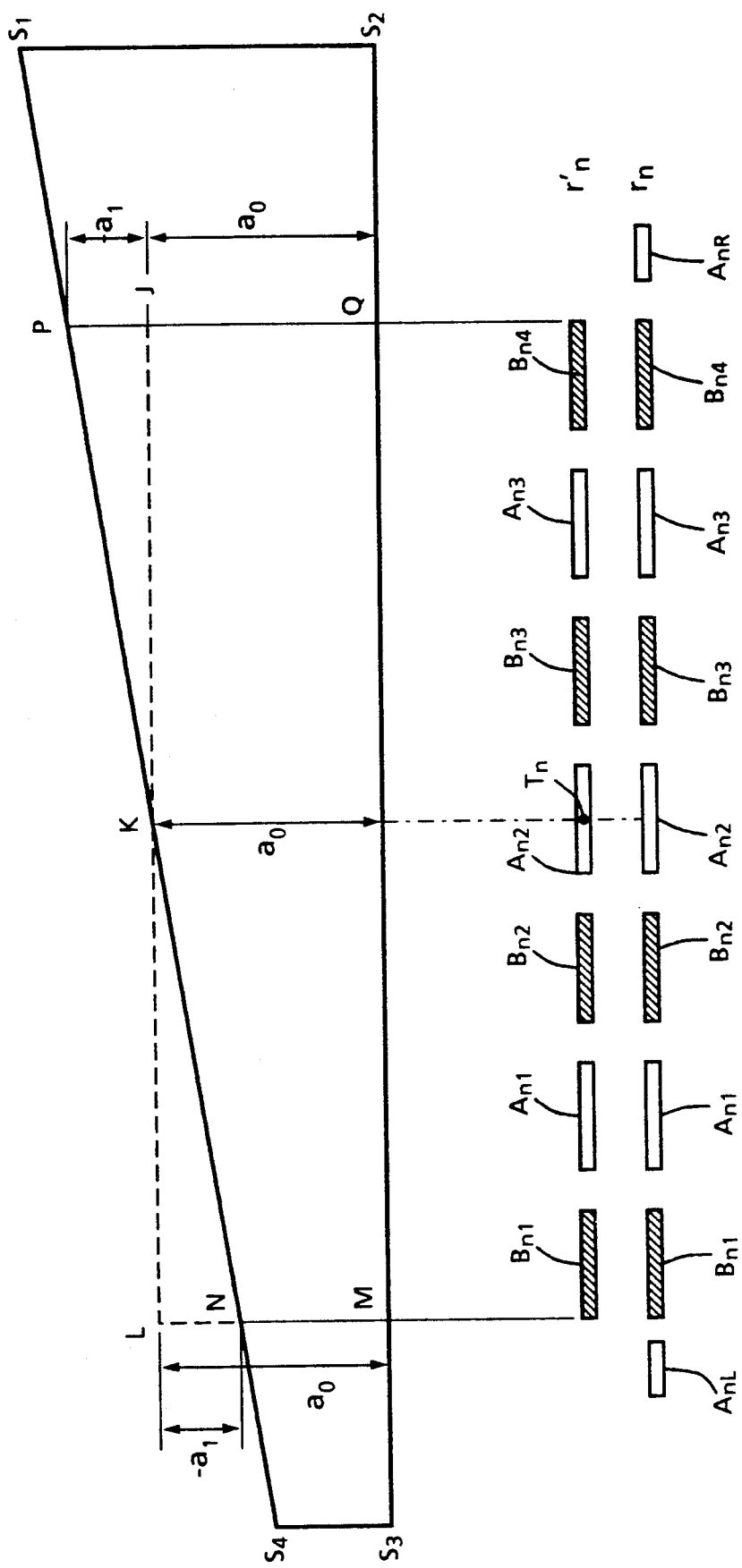
FIG. 10 is a view showing the distribution of the background light on a row representative of all rows except for the first row of the binary photo position sensor.

The photo binary sensor of this invention is also designed to cancel the effect of the background light. Referring to FIG. 10, the background light has more intensity on one side and less intensity on the other side as illustrated on graph $S_1S_2S_3S_4$. The intensity of light on the $S_1S_2$ side is more than the intensity of the light on the $S_3S_4$ side. Of course, the distribution of the intensity of the background light can be the opposite of what is shown in FIG. 10, but for the purpose of clarity hereinafter, the distribution shown on FIG. 10 is discussed.

The distribution of background light for each of photocells has two components: a uniform component shown as MLJQ and a nonuniform component shown as LNPJ. The uniform component MLJQ has a uniform intensity of $a_0$ which is the average light shining on the photocells on that row. The nonuniform component LNPJ theoretically has a negative intensity of $-a_1$ at LN and moving away from LN towards point K (the point which is aligned with center $T_n$ of row $r'_n$), the negative intensity decreases and at point K the intensity becomes zero. Moving away from point K towards PJ, the intensity is positive and it increases as it approaches PJ and at PJ the nonuniform component LNPJ has an intensity of $+a_1$. As it is shown in FIG. 10, adding the uniform component MLJQ to the nonuniform component LNPJ results in the background light.

Figure 10A:
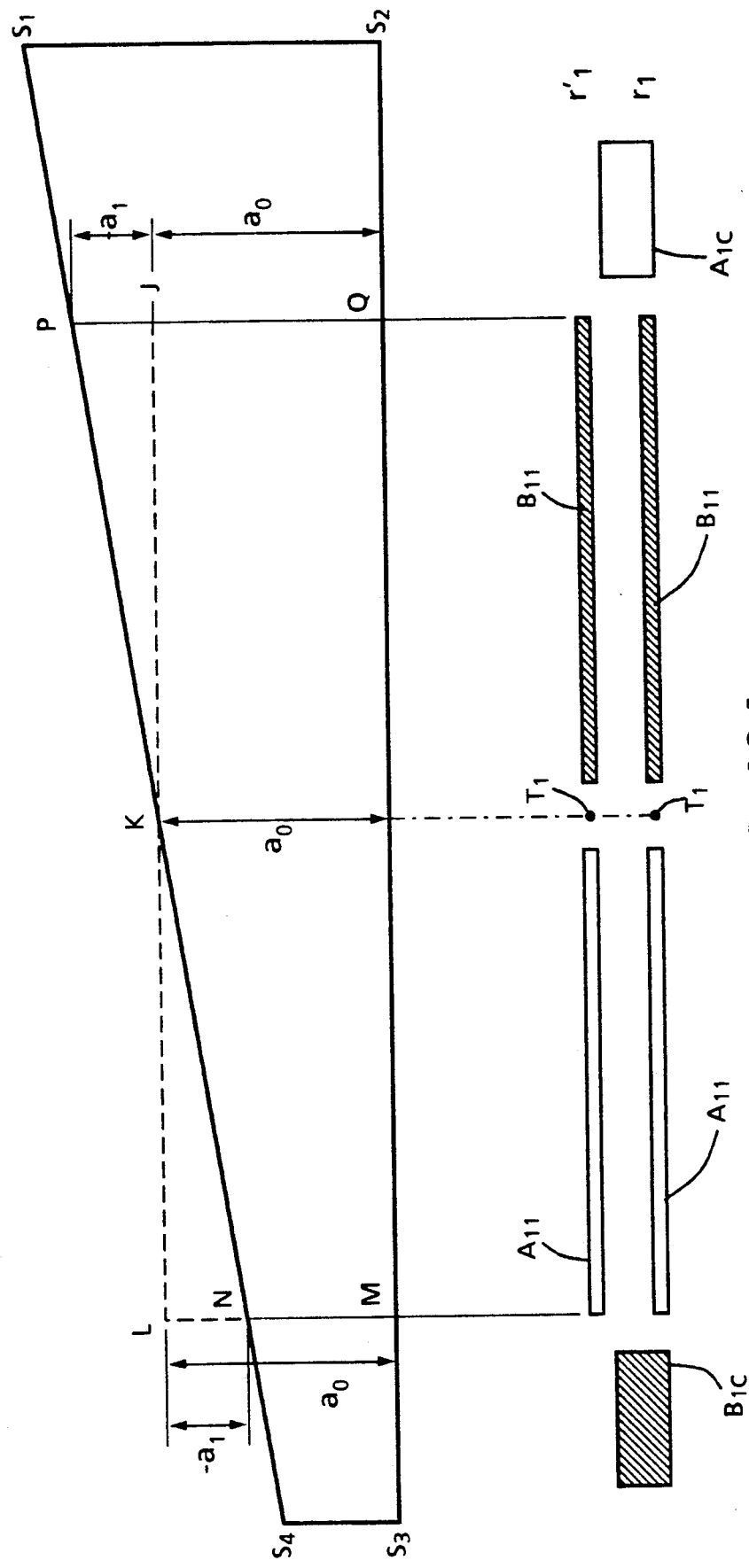
FIG. 10A is a view showing the distribution of the background light on the first row of the binary photo position sensor.

To cancel out any background light effects on the sensors, the array is designed so there is symmetry for each row about its center or, in other words, equal areas of logic zero sensors on each side of the center are equal distances away from the center and equal areas of logic one sensors on each side of the center are equal distances away from the center. For example, the center of $B_{n2}$ and the center of $B_{n3}$ area equal distances from line K—K or the center of $A_{n1}$ and the center of $A_{n3}$ are equal distance from line K—K. Also, the center of $A_{n2}$ on the left side of line K—K and the center of $A_{n2}$ on the right of line K—K are equal distances from line K—K. Since there is a symmetry on either side of the center $T_n$ of the row $r'_n$, the positive energy received by the photocells $A_{n2}$, $B_{n3}$, $A_{n3}$ and $B_{n4}$ on the right side of point $T_n$ is equal to the negative energy received by the photocells $A_{n2}$, $B_{n2}$, $A_{n1}$ and $B_{n1}$ on the left side of point $T_n$. As a result, the effect of nonuniform components is canceled. Except for the first row $r_1$ of FIG. 3, the symmetrical axis of each row is at the center $T_n$ of the middle photocell. Thus, the nonuniform component for all the rows, except for the first row $r_1$, is automatically canceled. For the first row $r_1$, as shown in FIG. 10A, the center $T_1$ of the row falls into the gap between the two photocells. Therefore, photocell $A_{11}$ receives the negative energy and the photocell $B_{11}$ receives the positive energy. To cancel the effect of this two opposite energies, an opposite photocell of sufficient area is added to each end $A_{1c}$ and $B_{1c}$ to add positive energy to group A and negative energy to group B for canceling the effect of nonuniform component LNPJ.

Referring back to FIG. 10, to cancel the effect of the uniform component MLJQ, the area of the photocells of opposite groups on each row should be equal. When the background light shines on two groups of photocells which have equal photocell areas, each group of photocells receive an equal amount of energy. Therefore, when the energy of the two groups are compared to each other the equal energy from the background light generated on each group is canceled out. As it is shown, row $r'_n$ has four photocells from group B ($B_{n1}$, $B_{n2}$, $B_{n3}$ and $B_{n4}$) and three photocells from group A ($A_{n1}$, $A_{n2}$ and $A_{n3}$). Consequently, one photocell from group A has to be added to row $r'_n$, but since there is a symmetrical requirement to cancel the nonuniform component LNPJ, the extra photocell has to be divided into half and each half $A_{nR}$ and $A_{nL}$ be placed at each end, as shown on row $r_n$. For row $r_1$, as shown in FIG. 10A, the area of the two photocells $A_{11}$ and $B_{11}$ are equal and also the area of the two compensating photocells $A_{1c}$ and $B_{1c}$ are equal. Therefore, the total are of group A is equal to the total area of group B which automatically cancels the effect of the uniform component MLJQ.

Figure 11:
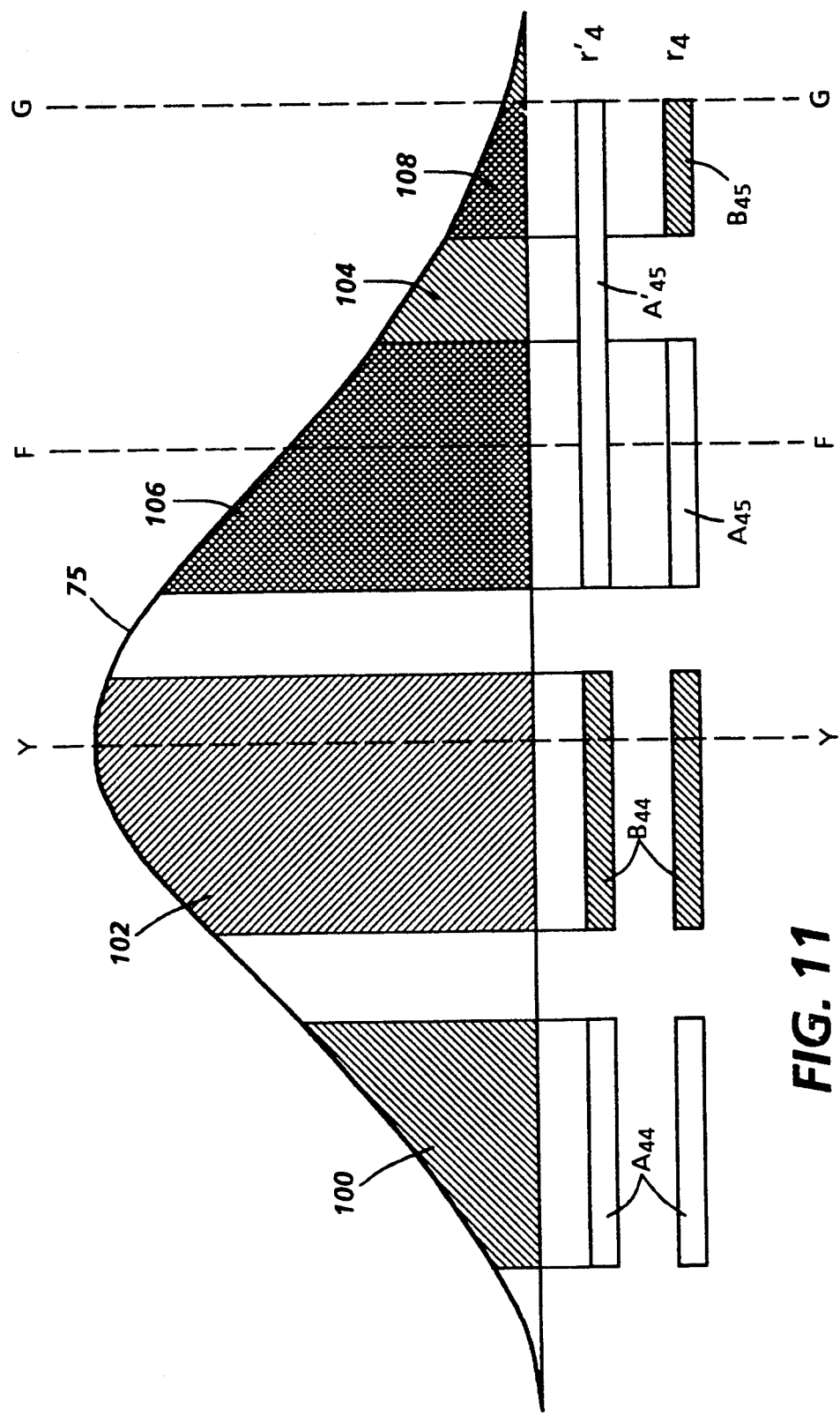
FIG. 11 is a view showing the Gaussian distribution of the laser beam sensor on photocells with a pitch approximately equal to ¼ of the laser beam width at the edge of the scanning region and in the border region.

Referring back to FIG. 3, the ending photocells $A_{11}$, $B_{11}$, $A_{21}$, $A_{22}$, $A_{31}$ and $A_{33}$ of the top rows $r_1$, $r_2$ and $r_3$ are extended to the edge G and D of the border regions DE and FG in order to sense the laser beam at the edge. Starting with row $r_4$ and thereafter, instead of extending the ending photocells the alternate pattern of the photocells is repeated. As is shown in FIG. 11, the photocells on row $r'_4$ are so small that a Gaussian distribution of a laser beam covers several photocells on the same row. Extending the ending photocell $A_{45}$ to the end of the boarder region FG can cause an error in the read out. If the peak Y—Y of the Gaussian distribution 75 of laser beam crosses the photocell $B_{44}$ next to the ending photocell $A'_{45}$, the photocells $A_{44}$, $B_{44}$ and $A'_{45}$ receive the energies shown under curves 100, 102 and 104 respectively. As it is obvious, the total energy received by the photocells $A_{44}$ and $A'_{45}$ is more than the energy received by the photocell $B_{44}$ which is a wrong read out. Since the peak Y—Y of the laser beam is on the photocell $B_{44}$, the energy received by the photocell $B_{44}$ should be more than the energy received by the A photocells.

To solve the above problem, instead of extending the ending photocells to the end of the border region FG, the alternate pattern of the photocells should be repeated, as shown on row $r_4$. Having the alternate pattern continued into the border region FG guarantees a correct read out. If the peak Y—Y of the Gaussian distribution 75 of laser beam crosses $B_{44}$, the photocells $A_{44}$, $B_{44}$, $A_{45}$ and $B_{45}$ receive the energies shown under curves 100, 102 106 and 108 respectively. By using the arrangement shown on row $r_4$, the total energy received by the A photocells is less than the integral energy received by the B photocells. Of course, on the top rows $r_1$, $r_2$ and $r_3$, the above problem does not exist. As shown in FIG. 11A, when the photocells are long, extending the ending cell $A_{33}$ of row $r_3$ to the end of the border region FG does not have any effect on the read out. If the peak Y—Y of the laser beam 75 crosses the photocell $B_{32}$ which is next to the ending photocell $A_{33}$, as it is obvious, the energy 110 received by the photocell $B_{32}$ is larger than the energy received by the photocell $A_{33}$. Therefore extending the ending photocell $A_{33}$ does not generate any wrong read out.

Referring back to FIG. 3, in operation, the laser beam crosses the binary photocell array in the direction of Z—Z. As the laser beam crosses the binary photocell array, it energizes one or multiple photocells on each row. Depending on if the concentration of energy is on the photocells from group A or group B, one of these two groups of photocells A or B collects more energy. The comparator for each row compares the outputs of groups A and B to determine the Grey logic value represented by that row. Referring to FIG. 5, the outputs of the comparators 40, 42, 44 and 46 and the output of the exclusive OR 68, on Bit1 and the output lines 52, 54, 56 and 70, respectively, represent a Grey number which identifies the position at which the laser beam crosses the photocell array. As an example, the laser beam crossing the photocell array 30 of FIG. 3 in the direction of Z—Z, generates a Grey output of (01001) which is equivalent binary (01110).

The outputs of these comparators 40, 42, 44 and 46 and the output of the exclusive OR 68 which represent a Grey number must be converted into a binary number. In converting the Grey format to the binary format, the binary logic value of each bit is the determining factor of the binary logic value of the following bit. Every time the binary value of a bit is 0, the Grey logic value of the following bit should be kept as the binary logic value of the following bit and every time the binary logic value of a bit is 1, the Grey logic value of the following bit should be inverted to produce a binary logic value of the following bit. Exclusive ORs 62, 64, 66 and 72 are used to convert the Grey format to a binary format by comparing the binary logic values of the previous bit to current Grey bit and produce the binary logic for that bit. There is no need to use an exclusive OR for the most significant bit since Bit1 of the binary format is the same as the Bit1 of the Grey format.

For example, the Grey output (10111), as shown in FIG. 12, is converted to binary format by considering the most significant bit which has the same logic value for Grey and binary format. Therefore, Bit1 has a logic value of 1 both for Grey and for Binary. Since in this example, Bit1 is 1 the Grey logic value of the Bit2 should be inverted to generate the binary logic value of that Bit2 so 0 should be inverted to 1. The binary value of Bit2 which is 1 indicates that the Grey logic value of the Bit3 which is 1 should be inverted to produce the binary logic value of the Bit3. The binary value of Bit3 which is 0 indicates that the Grey logic value of the Bit4 which is 1 should be kept as the binary logic value of the Bit4. Finally, the binary value of Bit4 which is 1 indicates that the Grey logic value of the Bit5 which is 1 should be inverted to produce the binary logic value of the Bit5. Therefore, the binary logic value of this example is 11010.

This invention solves the aforementioned problem of the prior art regarding the improvement of the resolution. By replacing the apertures and the nontransparent segments of the prior art with alternate photocells, the light can be sensed at any position. Also, by not reducing the pitch of the photocells to less than ¼ of the width of the beam and by offsetting the rows of photocells a higher resolution (a fraction of the width of a laser beam) can be achieved. By utilizing the method of offsetting the rows rather than reducing the pitch size, one can design a high resolution sensor to sense wider beams. An additional advantage of this embodiment is the built-in background light compensation. The compensating photocells of each row cancel the effect of the background light on each row to produce substantially error free read out of the position of the laser beam.

We claim:

1. An apparatus for detecting the position of a scanning beam comprising:
 a plurality of rows of spaced apart sensors;
 each of said rows of sensors having a plurality of logic zero sensors and a plurality of logic one sensors being arranged in alternating logic order;
 a scanning region;
 an additional region on each side of said scanning region;
 each of said rows being within said scanning region and extending beyond said scanning region into said additional region;
 the total area of said logic one sensors and the total area of said logic zero sensors of each of said plurality of rows being equal; and
 said plurality of rows being arranged such that each row is symmetrical about its center with those areas of logic zero sensors on each side of the center which are equal distances away from the center being equal and those areas of logic one sensors on each side of the center which are equal distances away from the center being equal to substantially cancel out any background light effects on the sensors of each row.

2. The apparatus as recited in claim 1, wherein said scanning region has a center and at least two of said plurality of rows having their centers offset from said center of said scanning region.

* * * * *